United States Patent [19]

Kraft

[11] Patent Number: 5,343,481
[45] Date of Patent: Aug. 30, 1994

[54] BCH ERROR-LOCATION POLYNOMIAL DECODER

[76] Inventor: Clifford H. Kraft, 320 Robin Hill Dr., Naperville, Ill. 60540

[21] Appl. No.: 73,606

[22] Filed: Jun. 4, 1993

Related U.S. Application Data

[63] Continuation of Ser. No. 637,694, Jan. 7, 1991, abandoned.

[51] Int. Cl.$^5$ ............................................. G06F 11/10
[52] U.S. Cl. .................................................. 371/37.1
[58] Field of Search ................... 371/37.1, 37.7, 40.1, 371/10.1, 21.1, 43, 44, 45, 37.4, 37.8, 30

[56] References Cited

U.S. PATENT DOCUMENTS

| | | | |
|---|---|---|---|
| 3,629,824 | 12/1971 | Bossen | 371/37.4 |
| 3,697,948 | 10/1972 | Bossen | 371/37.4 |
| 4,468,769 | 8/1984 | Koga | 371/37.8 |
| 4,608,692 | 8/1986 | Nagumo et al. | 371/37 |
| 4,694,455 | 9/1987 | Koga et al. | 371/37 |
| 4,833,678 | 5/1989 | Cohen | 371/37 |
| 4,841,300 | 6/1989 | Yoshida et al. | 341/94 |
| 4,845,713 | 6/1989 | Zook | 371/37 |
| 4,856,004 | 8/1989 | Foster et al. | 371/37.8 |
| 4,866,716 | 9/1989 | Maki et al. | 371/37.1 |
| 4,890,286 | 12/1989 | Hirose | 371/37.1 |

OTHER PUBLICATIONS

C. Kraft, "Closed Solution of the Berlekamp-Massey Algorithm for Fast Decoding of BCH Codes," IEEE International Conference on Communications, Apr. 1990 p. 307.3.1.

Primary Examiner—Robert W. Beausoliel, Jr.
Assistant Examiner—Phung My Chung
Attorney, Agent, or Firm—Clifford H. Kraft

[57] ABSTRACT

An error correction circuit wherein the coefficients of the error-location polynomial $\sigma(x)$ of any three-error correcting binary BCH code over the Galois Field $GF(2^m)$ are found from the first three odd components $S_1$, $S_3$, and $S_5$ of the syndrome vector. The circuit traverses a binary decision tree to find the polynomial coefficients and can be realized totally with combinational logic. The correct equation for the final polynomial coefficients is found at the termination of the tree. The descent through this tree and the computation of the coefficients can be performed by parallel combinational logic. Addition over the Galois Field is performed in the standard representation with exclusive OR gates. Multiplication can be performed by converting the standard representation into a special representation that is passed through a pair of binary adders to form the product. Translation can then be made back to the standard representation. The coefficients of the error-location polynomial appear at the output of the circuit after a time representing the total combinational logic delay of the circuit from the time the syndrome vector is applied to the input.

2 Claims, 7 Drawing Sheets

BCH ERROR-LOCATION POLYNOMIAL DECODER

This is a continuation of application Ser. No. 07/637,694 filed Jan. 7, 1991, now abandoned.

BACKGROUND OF THE INVENTION

The invention relates to a fast error correction circuit for binary Bose Chaudhuri Hocquenhem (BCH) codes capable of correcting up to three errors. The invention more particularly relates to a circuit that performs the second step in decoding such codes, the determination of the error-location polynomial over the Galois Field $GF(2^m)$.

It is the function of an error correcting code to repair or fix data bits that are corrupted by transmission over a communications channel without using any reference to the original transmitted data other than what is received. This is many times accomplished by breaking the data into blocks, and then inserting extra parity or check bits into each block according to a mathematical scheme; such codes are called block codes. Binary BCH codes are one type of block codes. The method of coding a BCH block or codeword consists of dividing the binary polynomial represented by the data bits in the block by a special polynomial known as the generator polynomial of the code. The method of decoding a BCH code consists of three distinct steps: 1) computing a vector known as the syndrome vector; 2) determining an error-location polynomial from the syndrome vector; 3) finding the roots of the error-location polynomial which represent the locations of the errors. The actual repair or fixing of the erroneous bits for a binary BCH code is then simply a matter of changing them to the opposite binary value i.e. one to zero, etc.

The encoding of a BCH code is strictly a binary polynomial division operation that takes place entirely in the Galois Field $GF(2)$. Decoding on the other hand, takes place almost entirely on the extension field $GF(2^m)$, where m is a positive integer that determines the size of a codeword. Codewords are of length $2^m-1$. The number of data and parity bits in the codeword is determined completely by the error correcting ability of the code. The current invention is only concerned with binary BCH codes that have an error correcting ability of three errors.

The components of the syndrome vector are defined over the Galois Field $GF(2^m)$, and each can be represented in what is known as the standard representation by m binary bits. The standard representation of any Galois Field quantity uses each binary digit (bit) to indicate the presence or absence of a given power of the primitive element $\alpha$ over the Galois Field. The low order bit indicates the presence or absence of $\alpha^0$; the next higher order bit indicates the presence or absence of $\alpha^1$; the next higher order bit indicates the presence or absence of $\alpha^2$, etc. It is well known in the theory of Galois Fields that one needs only m such bits to represent any element of the field $GF(2^m)$. For a three-error correcting BCH code, there are six components of the syndrome vector $S_1, S_2 \ldots, S_6$. Each of these is a Galois Field quantity. Only three of the six components are independent, as the even numbered components can always be derived from the odd numbered components by the equation $S_{2j}=S_j^2$. Thus, the only components of the syndrome vector needed to decode any three-error correcting binary BCH code are $S_1$, $S_3$, and $S_5$. These first three odd syndrome components can be computed by well known formulas from the received codeword using a straightforward process. In this invention all Galois Field quantities are represented by m+1 bits, rather than the normal m bits. The first m bits represent the quantity in the normal way in the standard representation or they represent it in a special representation more suited for field multiplication. The m plus first bit is always a zero indicator bit. It is set to one if the field quantity is zero, and it is set to zero if the field quantity is non-zero. When this bit is set, the other m bits have no meaning. In the standard representation, this bit is redundant; however, in the special representation, it is absolutely necessary, as the first m bits represent the exponent or power of the primitive field element $\alpha$ that yields the element. There is no power of $\alpha$ for the zero member of the field; hence there is no convenient way to represent zero with the first m bits (it could be represented with a unique coded pattern; however, this is not convenient). The zero indicator bit provides a very fast way to determine if the field element is zero or non-zero; it always has precedence over the other m bits. The standard representation thus represents the field element as $b_{m-1}\alpha^{m-1}+b_{m-2}\alpha^{m-2}+\ldots+b_1\alpha+b_0$; the special representation represents the element with the m bit binary value equal to any positive integer between 1 and $2^m-2$, as the entire field consists of the elements $0,1,\alpha,\alpha^2,\alpha^3,\ldots,\alpha^{2^m-2}$. Thus, for example, the field element $\alpha^{26}$ is represented as the binary integer 26 in the special representation. The field element 1 is $\alpha^0$ and is stored as 0. This obviates the need for a separate method to indicate when the desired field element is 0, as there is no power of $\alpha$ that equals 0. The special representation makes multiplication over the field become a modulo addition over integers, as addition of exponents is equivalent to multiplication by well-known mathematical principles. This allows very fast field multiplication.

The second decoding step, that of converting the components of the syndrome vector into the error-location polynomial, is much more difficult than the first or third steps, and is the subject of the present invention. The error-location polynomial for a three-error correcting BCH code is a third order, or lower, polynomial whose coefficients belong to the field $GF(2^m)$. This polynomial's lowest order coefficient is 1, and its roots can be directly used to find the bits that are in error in the received codeword by well known methods. Mathematically, finding this polynomial consists of solving a system of non-linear equations over the Galois field or an equivalent simplification of this process. The basic method was developed by E. Berlekamp [1] [E. R. Berlekamp, Algebraic Coding Theory, Aegean Park Press, 1984, pp. 176-184]. For the special case of binary BCH codes, an iterative algorithm exists that can find the polynomial coefficients. It was developed by Lin [2] [S. Lin, An Introduction to Error-Correcting Codes, Prentice Hall, Englewood Cliffs, N.J., 1970, pp. 122-129]. In April 1990, I published a method of converting Lin's iterative method into a descent through a binary decision tree to yield an equation for each polynomial coefficient. [3] [IEEE International Conference on Communications, April 1990, C. Kraft, "Closed Solution of the Berlekamp-Massey Algorithm for Fast Decoding of BCH Codes", pp 458-462]. The invention is an embodiment of that method.

The invention can be realized as a VLSI integrated circuit or a discrete circuit that takes the first three odd components of a computed syndrome vector and produces the three non-trivial components of the error-location polynomial $\sigma(x)$ over $GF(2^m)$. $\sigma(x)$ can be written as:

$$\sigma(x) = 1 + \sigma_1 x + \sigma_2 x^2 + \sigma_3 x^3$$

The non-trivial coefficients are the coefficients of x to any positive power. The coefficient of $x^0$ is always 1 for any error-location polynomial, and thus is considered a trivial coefficient. The circuit traverses a binary decision tree and solves formulas as I described in April 1990 [3]. The exact values of the syndrome components of any given received codeword are determined by the number of errors and are computed externally to my invention. Given the computed syndrome components, my invention makes a descent through a three-level binary tree to find the correct formulas for the polynomial coefficients. These coefficients are then computed and presented to the output port. The entire process can be performed by a combinational circuit (one having no clock) if the values of the syndrome components are held at the input port for the duration of the circuit logic delay. After this logic delay, the non-trivial coefficients of the error-location polynomial appear at the circuit's output port.

In decoding BCH codes it is very important to be able to determine the error-location polynomial quickly because it is the most time consuming step. There are well known methods of computing the syndrome vector and finding the roots of the error-location polynomial that can be realized with fast electronic circuits. Thus, it is primarily the speed (time delay) with which the error-location polynomial can be found that determines the overall speed of the decoder. Became the invention can be realized by a combinational circuit, the only delays encounted are those of its individual logic elements. Thus the method of the invention can find the error-location polynomial for any three-error correcting BCH code at bit rates in the hundreds of megabits per second. The very feasibility of using BCH codes in high speed applications depends on how fast the decoder can operate. Thus, any speedup of the second decoding step (that of finding the error-location polynomial) allows a major advance in the applicability of real-time BCH codes to fast data transmission or storage systems.

DESCRIPTION OF PRIOR ART

The BCH decoders found in prior art have focused on two major areas: 1) They have considered codes that correct two errors or less rather than three. 2) They teach methods of directly solving the system of non-linear equations first presented by Berlekamp. For example, in U.S. Pat. No. 4,890,286 Hirose teaches a complete decoder for codes that contain only a single bit error, and in U.S. Pat. No. 4,608,692 Nagumo et al. teach the use of formulas for the two error correcting BCH code. The two error correcting formulas have been in prior art for several years, yet no obvious way was found to extend them to a three error correcting code (or one with greater capability) until I published the method of this invention in April 1990 [3]. U.S. Pat. Nos. 4,873,688 (Maki) and 4,841,300 (Yoshida) use Euclid's algorithm to directly solve Berlekamp's equations. These decoders can be used, in principle, for codes capable of correcting any number of errors, and for non-binary BCH codes such as the Reed-Solomon codes. Strictly considered as decoders, these inventions are very powerful; however, they tend to be fairly slow when implemented in circuitry. Because they require many iterative steps, they are always realized with sequential logic (circuits having a clock). In general, it requires many clock cycles for these decoders to perform the second decoding step of converting the syndrome vector into an error-location polynomial. They are therefore not suited for very high speed decoders. The polynomial finding step in U.S. Pat. No. 4,833,678 (Cohen) teaches a method of successive approximations where partial polynomials are built up until the correct error-location polynomial is reached. Again, in principle, this method can be used to decode codes of any error correction capability; however it too is very slow and requires many sequential steps. The decoder in U.S. Pat. No. 4,845,713 a (Zook) actually solves an iterative technique for the polynomial. Once again this involves many sequential steps and hence is slow. My reduction of Lin's method for the three-error correction binary BCH code to a set of formulas as presented in reference [3] has made it possible to realize the second decoding step with a combinational circuit, thus reducing the delay of computation to an absolute minimum. The novelty of my invention over prior art rests in its ability to find the error-location polynomial for any three-error correcting (or less) binary BCH code with several very fast computations over the Galois Field $GF(2^m)$. This allows it to be realized with a combinational circuit with no delays other than logic propagation delays. The circuit can be realized either as a VLSI device or a discrete circuit. Prior art teaches iterative methods to find the error-location polynomial either by Euclid's method, Lin's iterative table technique or polynomial successive approximation. The current invention teaches the non-iterative use of a derision tree with closed formulas over the Galois Field for the polynomial coefficients. Prior art teaches the use of sequential circuits using many clock cycles; this invention teaches a combinational circuit with no clocks and no sequential operations. There is no suggestion of obviousness in prior art that one can pre-solve Lin's iterative table method to find a fixed decision tree and formulas for the error-location polynomial coefficients as I did in reference [3] and as is found embodied in the current invention, and there is no suggestion of obviousness that one can build a binary BCH decoder that uses no clocks.

SUMMARY OF THE INVENTION

It is therefore the object of the present invention to provide a fast combinational decoder circuit capable of being realized as a VLSI device or a discrete circuit that converts the first three odd components of the syndrome vector of a three-error correcting (or less) binary BCH code into the three non-trivial coefficients of the error-location polynomial over the Galois Field $GF(2^m)$.

It is another object of the present invention to provide an error flagging means that indicates when an error has corrupted the received data to an extent that exceeds the capability of the code to correct.

These and other objects are achieved according to the present invention by providing an input port means where the first three odd components of the computed syndrome vector can be entered and held, a combinational logic means that determines the correct form of the computation of the polynomial coefficients by means of a descent through a three-level binary decision tree that is based on a set of tree decision variables, a combinational logic calculation means means that computes the coefficients of the error-location polynomial, and an output port means where the coefficients of the error-location polynomial can be collected after a fixed circuit logic delay. The correct descent through the binary tree is made by a decision means that examines the tree decision variables as the descent progresses. If a received error exceeds the capability of the code to correct three errors, an error flagging means outputs an error flag.

DETAILED DESCRIPTION OF THE INVENTION

Figure 1:
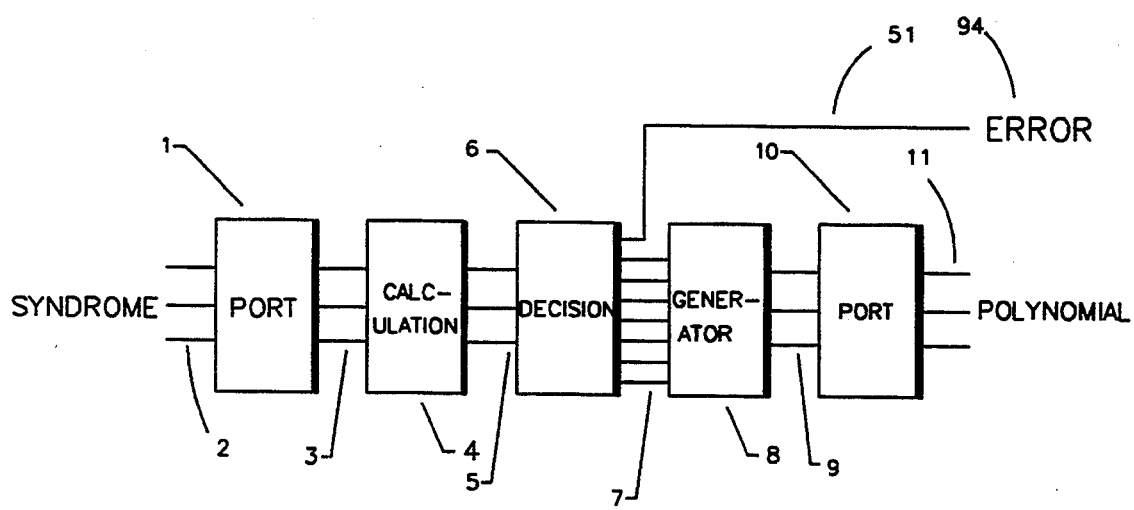
FIG. 1 is a block diagram of the circuit which serves to illustrate the invention.

FIG. 1 clearly depicts the operation of the invention. The method of finding the error-location polynomial is achieved as follows: The three odd components of the syndrome vector 2 are entered into an input port means 1 which holds them and presents them to calculation means 4 by m+1 bit buses 3. Calculation means 4 computes three tree decision variables that are presented to decision means 6 by buses 5 along with the syndrome components from input port means 1 (not shown in FIG. 1 for clarity). Decision means 6 performs the binary tree traversal I describe in reference [3] and produces a plurality of temporary control bits 7 which drive polynomial generator 8. Polynomial generator 8 produces the three non-trivial coefficients 9 of the error location polynomial which are held by output port means 10 and presented as the error-location polynomial 11 for the current received code vector. If an error occurs that exceeds the capability of the code to correct, error flag 94 is set from decision means 5 via signal line 51.

Figure 2:
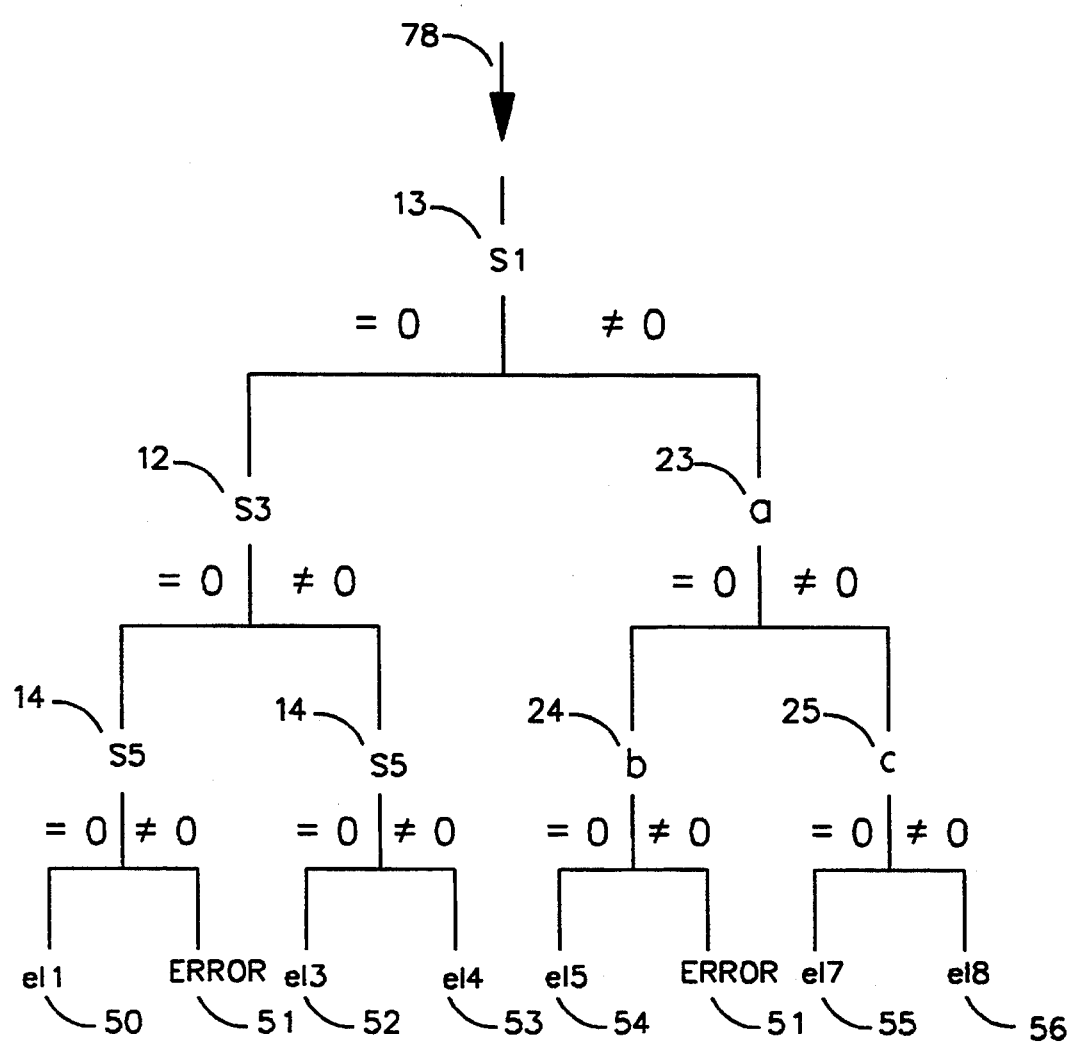
FIG. 2 is a diagram of the decision tree which must be traversed to find the correct form of the error-location, polynomial coefficients.

There now follows a detailed explanation of the overall operation of the invention depicted in FIG. 1. The binary tree of FIG. 2 represents the essence of the invention and is traversed by decision means 6 of FIG. 1. The traversal of this decision tree leads to the correct coefficients of the error-location polynomial for the current received code vector. Referring again to FIG. 2, the tree is traversed starting at its root 78 by first examining the syndrome component $S_1$ 13. If this component is 0, a decision is made to go to the left; if not, a decision is made to go to the right. Thus at the second level of the tree either $S_3$ 12 or the tree decision variable a 23 must be examined depending upon which side of the tree the first level decision led to. The tree decision variable a 23 is computed from the components of the syndrome vector by the formula $a=S_3+S_1^3$. As can be understood from FIG. 2, at the second level of the tree, either the syndrome component $S_5$ 14 or one of the tree decision variables b 24 or c 25 must be examined next. The tree decision variable b 24 is computed from components of the syndrome vector by the formula $b=S_5+S_1^5$, and the tree decision variable c 25 is computed from the components of the syndrome vector and the tree decision variables a 23 and b 24 by the formula $c=b+aS_1^{-1}S_3$, where $S_1^{-1}$ is the multiplicative inverse of $S_1$ over the $GF(2^m)$. The results of this tree descent then lead to temporary control bits el1 50, el3 52, el4 53, el5 54, el7 55, or el8 56 or an error condition 51. These control bits are generated by the decision means 6 shown in FIG. 1. Only one temporary control bit is set to 1 at any given time. The tree decision variables a 23, b 24, and c 25 are generated by the calculation means 4 in FIG. 1. The control bits cause the polynomial generator 8 of FIG. 1 to make one of the the following choices as to the error-location polynomial:

el1: $\sigma(x)=1$ el3: $\sigma(x)=1+S_3x^3$ el4: $\sigma(x)=1+e_1x^2+S_3x^3$ el5: $\sigma(x)=1+S_1x$ el7: $\sigma(x)=1S_1x+e_2x^2$ el8: $\sigma(x)=1+S_1x+e_3x^2+e_4x^3$ where:

$e_1=S_5S_3^{-1}$ $e_2=aS_1^{-1}$ $e_3=ca^{-1}+aS_1^{-1}$ $e_4=ca^{-1}S_1$

The error condition 51 in FIG. 2 occurs when a received codeword has been corrupted by channel noise with more than three errors. In other words, an error has occurred that is beyond the capability of a three-error correcting BCH code to correct. This error condition 51 is output by the error flagging means 94 in FIG. 1.

The present invention computes the tree decision variables a 23, b 24, and c 25 in FIG. 2 in parallel, performing the necessary manipulations over the Galois Field. The tree decisions are then made in parallel with one and only one of the temporary control bits 7 being chosen (or the error signal 51 causing the error flagging means to set). Finally the correct polynomial coefficients are computed in parallel and chosen by the control bits in the polynomial generator 8 so that the three non-trivial coefficients appear at the output port means 11.

PREFERRED EMBODIMENT

Referring to FIG. 1, it can be seen that the syndrome vector 2 is applied to input port means 1. Input port means 1 can be a set of standard logic latches or it can be a set of bus buffers devices. It can also be embodied simply as a set of input conductors. Regardless of the embodiment, input port means 1 presents the first three odd components of the syndrome vector $S_1$, $S_3$, and $S_5$ to calculation means 4 via three m+1 bit buses 3. Calculation means 4 and decision means 5 provide a circuit for traversing a binary tree. Calculation means 4 provides the set of tree decision variables 5 used by the decision means to traverse the binary tree. Each component of the syndrome vector is represented by m+1 binary bits as previously described. This is clearly seen in FIG. 1. The tree traversal results in a set of temporary control bits 7 that control polynomial generator 8 of FIG. 1. Polynomial generator circuit 8 presents the three non-trivial coefficients of the error-location polynomial 9 to output port 10. Similar to input port 1, output port 10 may be a set of latches, buffers, or simply conductors that hold the output error-location polynomial coefficients 11.

Figure 3:
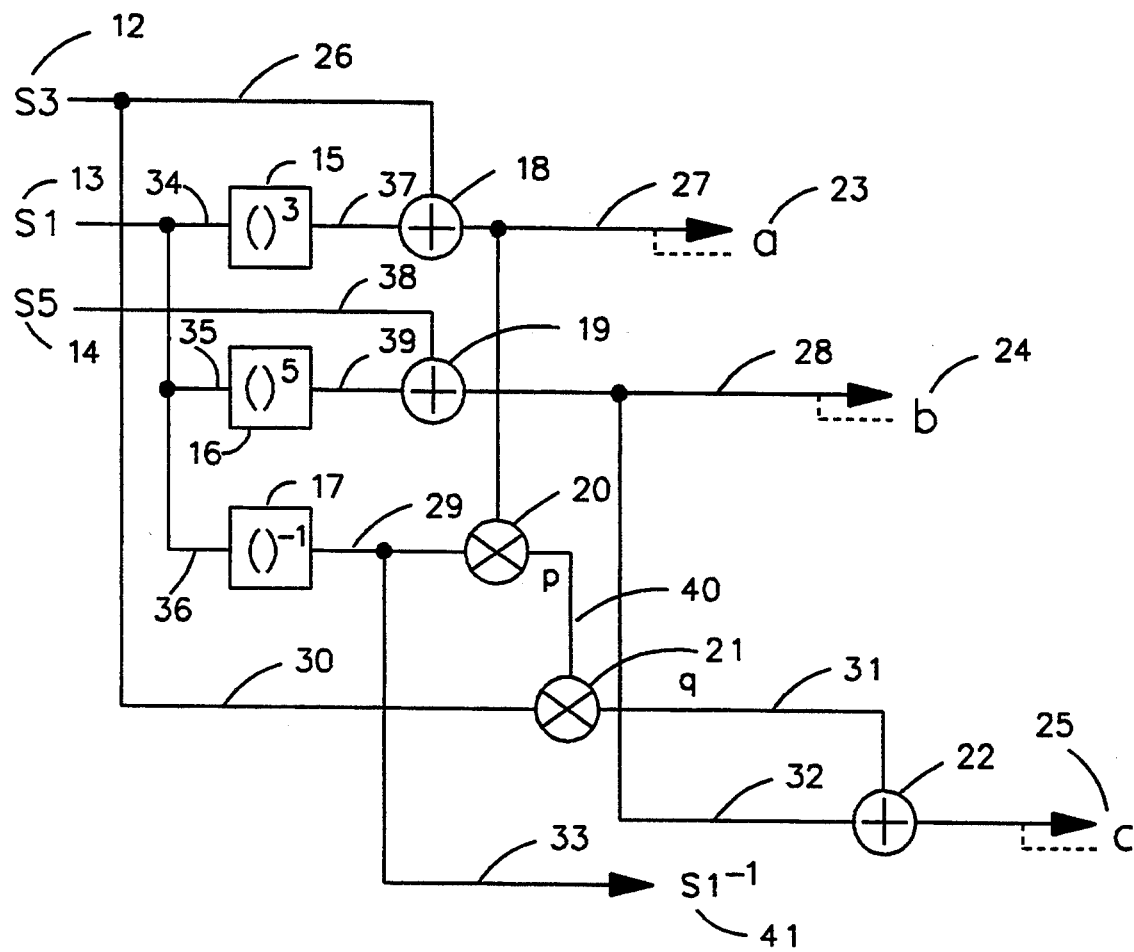
FIG. 3 is a circuit diagram of the calculation means of FIG. 1 that illustrates the steps needed to compute the tree decision variables a, b, and c that are used to traverse the tree illustrated in FIG. 2.

Calculation means 4 is shown in detail in FIG. 3 where it can be understood that the tree decision variables a 23, b 24, and c 25 are calculated from the above named components of the syndrome vector. The tree decision variable a 23 is calculated according to the formula over the Galois-Field $a = S_3 + S_1^3$ as previously described. The syndrome component $S_3$ 12 enters a means for transforming any Galois-Field variable into its third power over the field 15 by an m+1 bit bus 34. This third power means 15 may be a read-only memory. The m+1 bit output 37 of third power means 15 is connected to one input of a Galois-Field adder 18 via the m+1 bit bus 37. The other input to adder 18 is is the syndrome component $S_3$ 12 that is connected by the m+1 bit bus 26. The output of adder 18 is the m+1 bit bus 27 that represents the tree decision variable a 23. The tree decision variable a 23 is shown in FIG. 3 as a solid arrow from bus 27 and also as a dotted line. The solid arrow represents an m bit bus, while the dotted line is the m plus first bit of the tree decision variable a which is a zero indicator as previously described. The dotted line is shown in FIG. 3 simply for clarity. All m+1 bit buses in this embodiment consist of m bits which represent the Galois-Field variable and an m plus first bit which is a zero indicator as previously described.

The tree decision variable b 24 is calculated according to the the formula over the Galois-Field $b = S_5 + S_1^5$ as previously described. In FIG. 3, syndrome component $S_1$ 13 enters a means for transforming any Galois-Field variable into its fifth power 16 by the m+1 bit bus 35. This fifth power means may be a read-only memory. The output of fifth power means 39 enters a Galois-Field adder 19 by the m+1 bit bus 39. The other input to adder 19 is the syndrome component $S_5$ 14 that enters via the m+1 bit bus 38. The output of adder 19 is the m+1 bit bus 28 that represents the tree decision variable b 24, also shown by an arrow and a dotted line in FIG. 3.

The tree decision variable c 25 is calculated according to the the formula over the Galois-Field $c = b + aS_1^{-1}S_3$ as previously described. In FIG. 3, the syndrome component $S_1$ 13 enters a means for transforming any Galois-Field variable into its multiplicative inverse 17 by the m+1 bit bus 36. This multiplicative inverse means may be a read-only memory. The m+1 bit output 29 of multiplicative inverse means 17 is one input to a Galois-Field multiplier 20 and is also made available on an m+1 bit bus 33 for use by other circuits. This output represents the multiplicative inverse of $S_1$, namely $S_1^{-1}$ 41. The other input to Galois-Field multiplier 20 is the tree decision variable a 23 which is taken from the output of Galois-Field adder 19. The m+1 bit output of Galois-Field multiplier 20 becomes one input to Galois-Field multiplier 21. It is an m+1 bit quantity 40 and is represented by a temporary variable p. The second input to Galois-Field multiplier 21 is the syndrome component $S_3$ 12 which is brought via the m+1 bit bus 3t). The m+1 bit output 31 of Galois-Field multiplier 21 is connected to Galois-Field adder 22 via the m+1 bit bus 31. This is represented by a temporary variable q. The other input to Galois-Field adder 22 is the tree decision variable b 24 which is brought via the m+1 bit bus 32 from the output of Galois-Field adder 19. The output of Galois-Field adder 22 is the tree decision variable c 25 also shown in FIG. 3 with an arrow and a dotted line.

Returning to FIG. 1, it can be understood that the output of calculation means 4 just described consists of three m+1 bit buses 5 representing the tree decision variables a 23, b 24, and c 25. The three m+1 bit buses 5 provide these three tree decision variables to decision means 6 that generates the temporary control bits that allow the traverse of the binary decision tree in FIG. 2. In addition to the three tree decision variables a, b, and c, the first three odd components of the syndrome vector $S_1$, $S_3$, and $S_5$ are also provided from input port means 1 to decision means 6. These additional three m+1 bit buses are not shown in FIG. 1 for cleariy.

Figure 4:
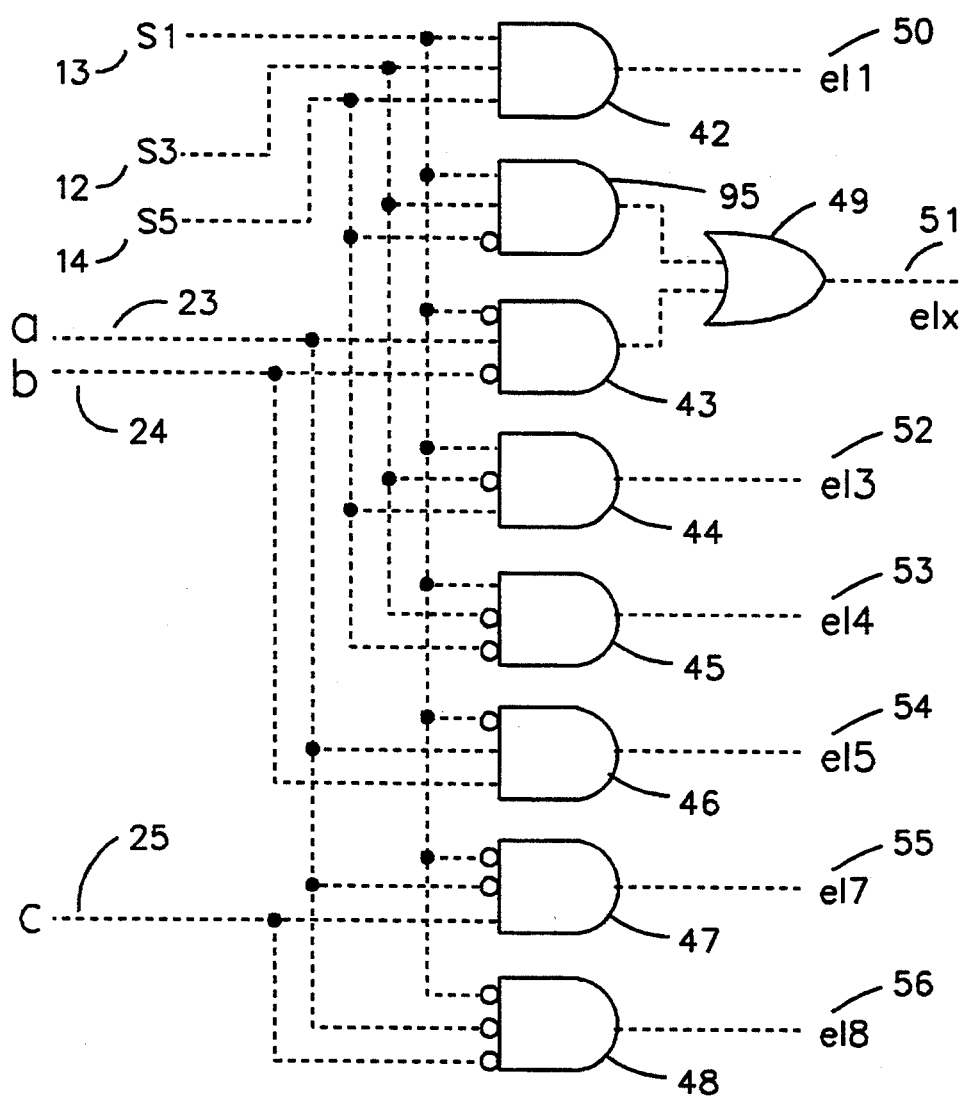
FIG. 4 is a circuit diagram of the decision means that converts the three components of the syndrome vector into a set of single binary bits el1, el3, el4, el5, el7, and el8 called temporary control bits of which only one is ever found in a binary 1 state at any time. These temporary control bits represent a specific path chosen through the tree based on the values of the components of the syndrome vector.

Decision means 6 of FIG. 1 is shown in detail in FIG. 4 which clearly depicts the generation circuit for six temporary control bits el1 50, el3 52, el4 53, el5 54, el7 55, el8 56, and an error flagging signal elx 51 from the zero indicators of syndrome components $S_1$ 13, $S_3$ 12, $S_5$ 14, and the zero indicators of the tree decision variables a 23, b 24, and c 25. The zero indicators are the m plus first bit of the m+1 bit variable in each case. Every path in FIG. 4 is a single bit or single conductor and is represented by a dotted line. This generation circuit uses eight And gates 42, 95, 43, 44, 45, 46, 47, and 48. Each of these And gates has a certain pattern of inversions on its input as indicated in FIG. 4 by small circles on some of the And gate inputs. This set of eight And gates represents the eight possible paths through the binary decision tree shown in FIG. 2. This combinational circuit computes the correct path through the tree given a syndrome vector computed from a received codeword. Only one of the six temporary control bits or the error flag 51 can attain the 1 state.

And gate 42 in FIG. 4 determines the output of the temporary control bit el1 50. A 1 state represents the a path through the three level tree of FIG. 2 of "left", "left", "left". This path is taken when all three of the syndrome components are 0 (each of their zero indicators is 1). And gates 95 and 43 in FIG. 4 produce error signals into Or gate 49 which in turn causes the error flag elx 51 to be 1. A 1 at the output of And gate 95 represents path through the tree in FIG. 2 of "left", "left", "right" where $S_1=0$, $S_3=0$, and $S_5\neq 1$, while a 1 at the output of And gate 43 represents the path through the tree of "right", "left", "right" where $S_1\neq 0$, $a=0$, and $b\neq 0$. Both of these two paths are caused by errors that are beyond the ability of the code to correct. A 1 at the output of And gate 44 causes the temporary control bit el3 52 to be 1 and represents the path through the tree of "left", "right", "left" where $S_1=0$, $S_3\neq 0$, and $S_5=0$. A 1 at the output of AND gate 45 causes the temporary control bit el4 53 to be 1 and represents the path through the tree of "left", "right", "right" where $S_1=0$, $S_3\neq 0$, and $S_5\neq 0$. A 1 at the output of And gate 46 causes the temporary control bit el5 54 to be 1 and represents the path through the tree of "right", "left", "left" where $S_1\neq 0$, $a=0$, and $b=0$. A 1 at the output of And gate 47 causes the temporary control bit el7 55 to be 1 and represents the path through the tree of "right", "right", "left" where $S_1\neq 0$, $a\neq 0$, and $b=0$. A 1 at the output of And gate 48 causes the temporary control bit el8 56 to be 1 and represents the path through the tree of "right", "right", "right" where $S_1\neq 0$, $a\neq 0$, and $b\neq 0$.

It is clear from FIG. 4 that one and only one of the temporary control bits el1 50, elx 51, el3 52, el4 53, el5 54, el7 55, or el8 56 can have the binary value of 1 at any time. That is to say that the circuit depicted in FIG. 4 represents a complete decoder for the decision tree of FIG. 2. It will be shown that these seven temporary control bits allow six choices for the possible coefficients of the error-location polynomial plus the possibility of an error that exceeds the capability of the code. The reason that only one of the temporary control bits can be 1 at any given time is due to the fact that the tree decision variables a 23, b 24, and c 25 are functions of the syndrome components $S_1$ 13, $S_3$ 12, and $S_5$ 14. The temporary control bits drive polynomial generator 8 of FIG. 1 to produce the correct coefficients of the error-location polynomial. It is clear from FIG. 4 that the temporary control bits represent the parallel decisions of a first decision means that decides whether $S_1$ is zero or not, a second decision means that decides whether $S_3$ is zero or not, a third decision means that decides whether $S_5$ is zero or not, a fourth decision means that decides whether $S_5$ is zero or not, (as did the third decision means), a fifth decision means that decides whether a is zero or not, a sixth decision means that decides whether b is zero or not, and a seventh decision means that decides whether c is zero or not, as well as means for setting the error flag when $S_5$ is not zero, and $S_3$ is zero, and $S_1$ is zero, or when b is not zero, and a is zero, and $S_1$ is not zero.

Figure 5:
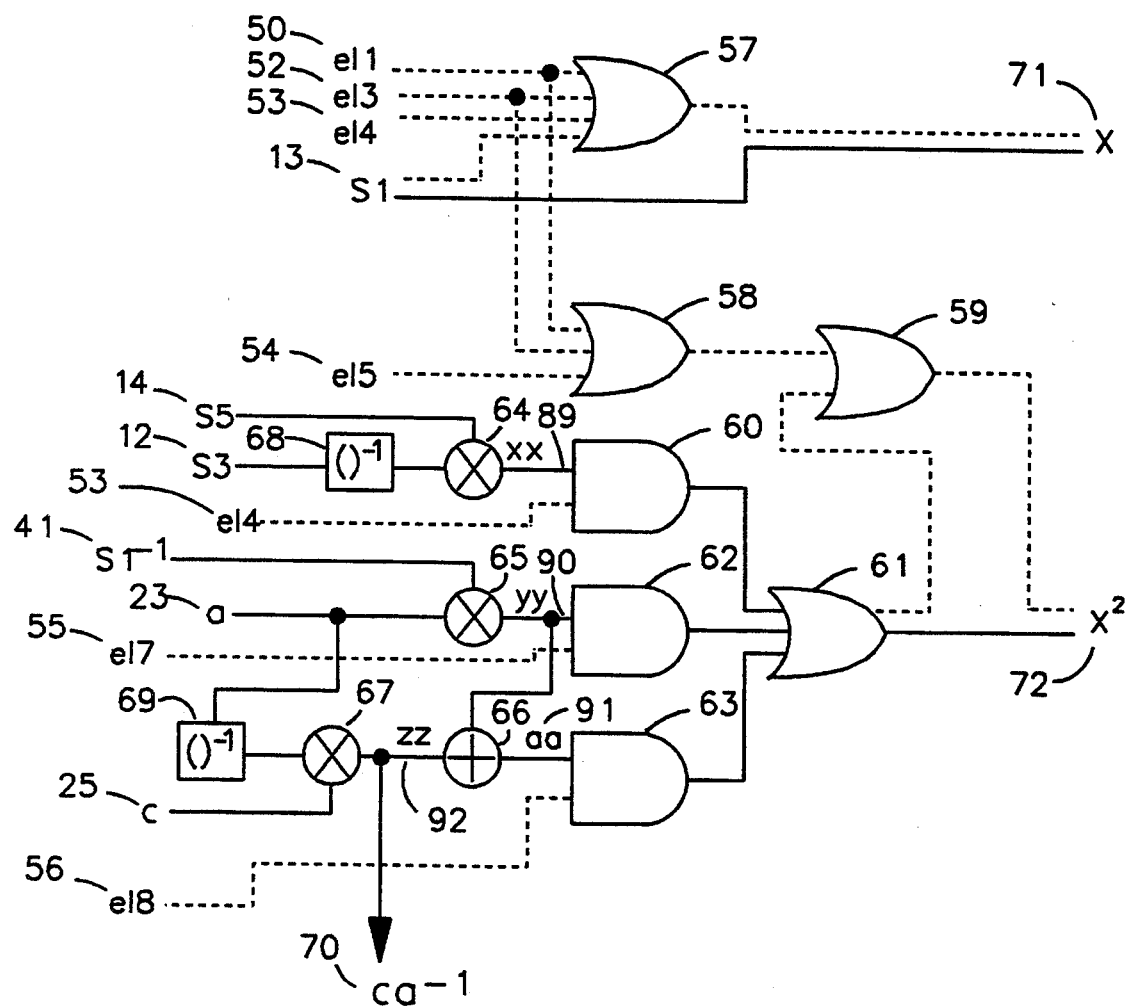
FIG. 5 is a circuit diagram of the first half of the polynomial generation means of FIG. 1. This circuit is driven to a certain result by the temporary control bits from the tree decision circuit from FIG. 4. This circuit computes the final values of the x and $x^2$ coefficients of the error-location polynomial.

FIG. 5 shows the the first part of polynomial generator 8 in FIG. 1. Here the first two nontrivial coefficients of the error-location polynomial, the coefficient of x and the coefficient of $x^2$ (the coefficient of $x^0$ is always equal to 1 and is thus trivial) are generated. In FIG. 5 dotted lines represent single bits or single conductors while solid lines represent m+1 bit buses. Each of these m+1 bit buses represents a Galois-Field variable. The first non-trivial coefficient of the error-location polynomial is the coefficient of x; this particular coefficient is always either zero or equal to the syndrome component $S_1$. Or gate 57 in FIG. 5 controls the m plus first bit (zero indicator) of this coefficient. The four inputs to this gate 57 are the three temporary control bits el1, 50, el3 52, and el4 53, and the zero indicator bit of the syndrome component $S_1$ 13. If any of these four inputs is set to 1, the first non-trivial coefficient of the error-location polynomial, the coefficient of x, is made zero by setting its zero indicator bit to 1 71 (dotted line). If none of these conditions hold (none of the inputs to gate 57 is 1), the first non-trivial coefficient of the error-location polynomial, the coefficient of x 71, is set to syndrome component $S_1$ 13.

Or gates 58 and 59 in FIG. 5 produce the zero indicator bit for the second non-trivial coefficient of the error-location polynomial, the coefficient of $x^2$. It can be clearly seen that if any of the temporary control bits el1 50, el3 52, or el5 54 is set, the output of Or gate 59 will set to the binary 1 state indicating that the coefficient of $x^2$ is zero. If none of these control conditions exist, the circuitry depicted by the rest of FIG. 5 generates the coefficient of $x^2$ of the error-location polynomial. It can be seen that Or gate 59 has a second input that comes from the bank of m+1 Or gates 61. If the m plus first bit of this bus is set, meaning that the chosen input for the coefficient of $x^2$ is zero, the zero indicator for this coefficient will be set.

The choice of inputs for the second non-trivial coefficient of the error-location polynomial, that of $x^2$, is made by the three groups of And gates 60, 62, and 63 of FIG. 5. Each of these And gate symbols in FIG. 5 represents a bank of m+1 actual And gates (the solid lines in the drawings represent m+1 bit buses). It can be seen that the first bank of And gates 60 is enabled by the temporary control bit el4 53. The second bank of And gates 62 is enabled by the temporary control bit el7 55, and the third bank of And gates 63 is enabled by the temporary control bit el8 56. Thus the coefficient of $x^2$ in the error-location polynomial can take on only three non-zero values for a given syndrome vector, or it can be zero (as indicated by its zero indicator, the output of Or gate 59).

When temporary control bit el4 53 is set, the value selected for the coefficient of $x^2$ is $S_5S_3^{-1}$. Syndrome component $S_3$ 12 enters a means for transforming any Galois-Field variable into its multiplicative inverse 68. The output of transforming means 68 is the first input into a Galois-Field multiplier 64. The second input to Galois-Field multiplier 64 is the syndrome component $S_5$ 14. The output of Galois-Field multiplier 64 is the temporary variable xx 89 whose m+1 bits enter the bank of And gates 60. If this bank of And gates is enabled by temporary control bit el4 53, the m+1 bits of temporary variable xx 89 pass on through the bank of m+1 Or gates 61 to become the coefficient of $x^2$ 72 of the error-location polynomial.

When temporary control bit el7 55 is set, the value selected for the coefficient of $x^2$ is $aS_1^{-1}$. The computed value $S_1^{-1}$ 41 enters Galois-Field multiplier 65 in FIG. 5 from the m+1 bit bus 33 in FIG. 3 where it was computed by transforming means 17. Tree decision variable a 23 is the other input to Galois-Field multiplier 65 in FIG. 5 from the m+1 bit bus 27 in FIG. 3 where it was computed. The output of Galois-Field multiplier 65 in FIG. 5 is temporary variable yy 90 which enters the bank of m+1 And gates 62 that are enabled by temporary control bit el7 55 when it is set. If temporary control bit el7 55 is set, the m+1 bits of temporary variable yy 90 pass through the bank of m+1 And gates 62 and on through the bank of m+1 Or gates 61 to become the coefficient of $x^2$ 72 of the error-location polynomial.

When temporary control bit el8 56 is set, the value selected for the coefficient of $x^2$ is $ca^{-1}+aS_1^{-1}$. Tree decision variable a 23 enters a means for transforming any Galois-Field variable into its multiplicative inverse 69 to become $a^{-1}$. The output of transforming means 69 is connected as one input to Galois-Field multiplier 67. The other input to Galois-Field multiplier 67 is the m+1 bits of tree decision variable c 25 that is computed in the circuit of FIG. 3. The output of Galois-Field multiplier 67 is the temporary variable zz 92 which forms one input to Galois-Field adder 66. The other input to Galois-Field adder 66 is temporary variable yy 90 as shown in FIG. 5. The output of Galois-Field adder 66 is the temporary variable aa 91 whose m+1 bits form one input to the bank of m+1 And gates 63 which is enabled by temporary control bit el8 56. When temporary control bit el3 is set, the bank of m+1 And gates 63 is enabled and temporary variable aa 91 passes through to the bank of m+1 Or gates 61 to become the coefficient of $x^2$ 72 of the error-location polynomial.

Figure 6:
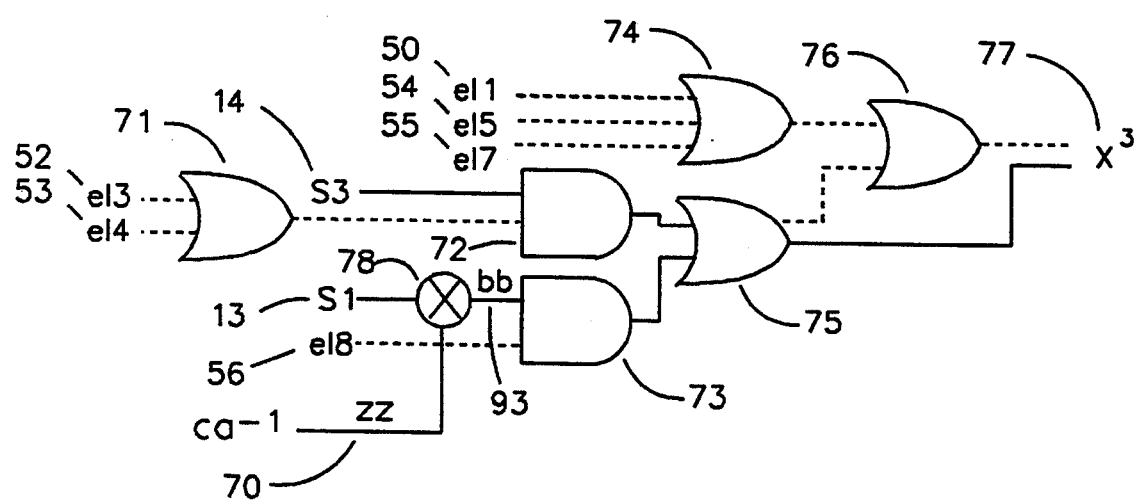
FIG. 6 is a circuit diagram of the second half of the polynomial generation means. This circuit is driven to a certain result by the temporary control bits from the tree decision circuit from FIG. 4. This circuit computes the final value of the $x^3$ coefficient of the error-location polynomial.

FIG. 6 shows the portion of the polynomial generator circuit that produces the coefficient of $x^3$ 77 of the error-location polynomial. When either of the temporary control bits el3 52 or el4 53 is set, the desired coefficient of $x^3$ is syndrome component $S_3$ 14. When temporary control bit el8 56 is set, the desired coefficient of $x^3$ is $ca^{-1}S_1$. When any of the temporary control bits el1 50, el5 54, or el7 55 is set, the coefficient of $x^3$ of the error-location polynomial is zero.

Or gate 74 in FIG. 6 has output of 1 when any of the three temporary control bits el1 50, el5 54, or el7 55 is set. This output is passed through Or gate 76 to set the zero indicator of the coefficient of $x^3$ 77 of the error-location polynomial. Also, if the m plus first bit from the bank of m+1 Or gates 75 is set (indicating the computed quantity is zero), this passes through Or gate 76 to set the zero indicator of the coefficient of $x^3$ 77 of the error-location polynomial.

When either of the temporary control bits el3 52 or el4 53, Or gate 71 produces an output of 1 enabling the bank of m+1 And gates 72. Syndrome component $S_3$ 14 is the other input to the bank of m+1 And gates 72. The m+1 bit output of this bank of And gates 72 passes through the bank of m+1 Or gates 75 to become the coefficient of $x^3$ 77 of the error-location polynomial.

When the temporary control bit el8 56 is set, the bank of m+1 And gates 73 is enabled. Syndrome component $S_1$ 13 is one input to Galois-Field multiplier 78. The other input to Galois-Field multiplier 78 is temporary variable zz 70 that is $ca^{-1}$ that was computed by Galois-Field multiplier 67 in FIG. 5. The m+1 bit output of Galois-Field multiplier 78 in FIG. 6 is the temporary variable bb 93 that forms the other input to the bank of m+1 And gates 73. When temporary control bit el8 58 enables this bank of m+1 And gates 73, temporary variable bb 93 passes through the bank of m+1 And gates 73 to the bank of m+1 Or gates 75 to become the coefficient of $x^3$ 77 of the error-location polynomial.

Figure 7:
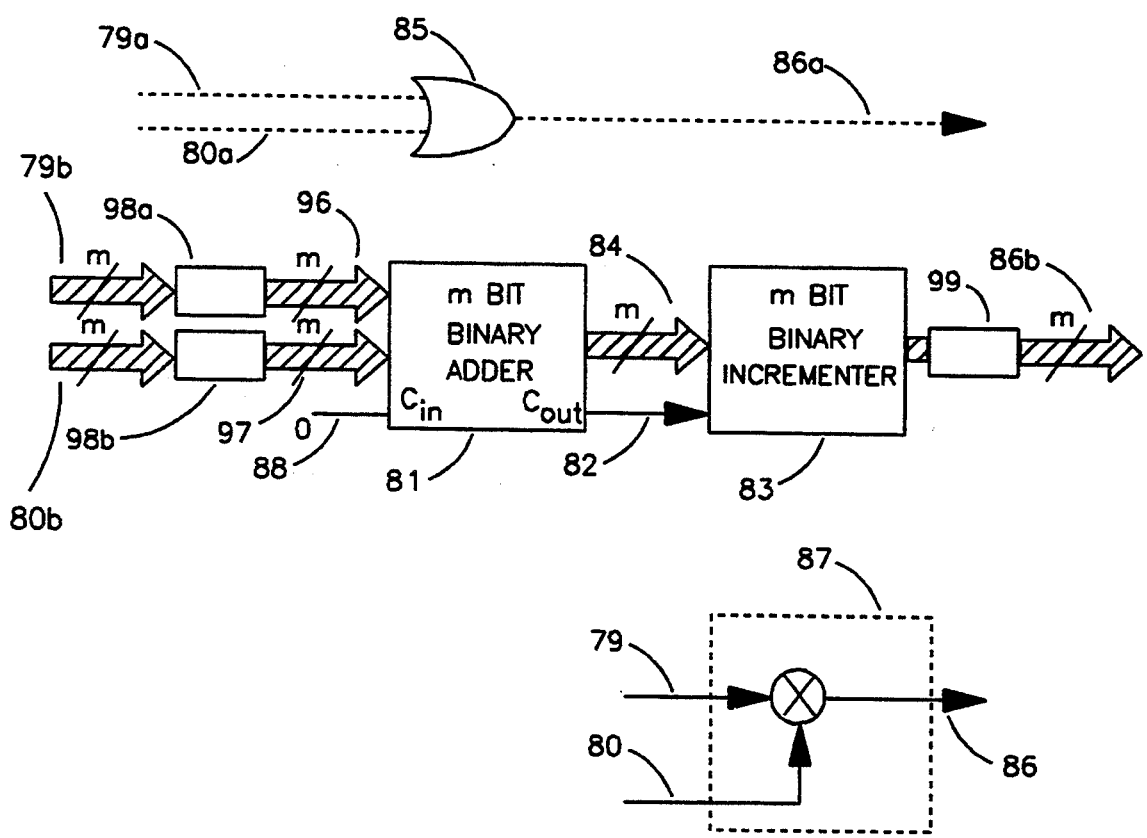
FIG. 7 is a circuit diagram of one possible embodiment of a combinational Galois Field multiplier using a pair of binary full adders.

FIG. 7 shows one possible embodiment of any of the previously mentioned Galois-Field multipliers. In the symbol 87 shown in FIG. 7, the multiplicand m+1 bit bus 79 enters the multiplier, and the multiplier m+1 bit bus 80 also enters the multiplier. The m+1 bit product leaves the multiplier on the right. In this possible embodiment of the multiplier, the m plus first bit of the incoming multiplicand 79a and the m plus first bit of the incoming multiplier 80a which are the zero indicator bits enter an Or gate 85 that outputs a 1 whenever either of its inputs is a 1. The output of Or gate 85 forms the zero indicator bit of the product 86a and is set to 1 indicating a zero product if either of the incoming zero indicators is set to one indicating that at either the multiplicand is zero, or the multiplier is zero, or both are zero. The first m bits of the multiplicand 79b, and the first m bits of the multiplier 80b pass through first and second read-only memories 98a and 98b respectively to be converted from the standard representation to the special representation previously described. First and second read-only memories 98 are both of size $2^m$ m bit words. The multiplicand now in special representation 96, and the multiplier now in special representation 97 form the two m bit inputs to a binary adder 81. The carry-in bit to this adder 88 is set to zero so that there is no carry-in. Because the multiplicand and the multiplier are now in special representation represented as powers of $\alpha$, it is only necessary to add these powers of $\alpha$ modulo $2^m-2$ to obtain the power of $\alpha$ representing the product. Thus adder 81 performs this m bit addition over the standard binary number field to obtain the m bit sum (without modulo). This sum 84 is fed into a binary incrementer 83. This device simply increments a binary number if its carry-in bit is set to 1 and passes the number through unchanged if its carry-in bit is set to 0. The carry-in bit 82 for the binary incrementer 83 is the carry-out bit of binary adder 81. The action of binary incrementer 83 is to modulo the sum from the binary adder 81 by modulo $2^m-2$. Thus the output of the binary incrementer 83 is the desired product in the special representation. This is passed through a third read-only memory 99 to transform the product 86b back to the standard representation. Read-only memory 99 is also of size $2^m$ m bit words.

It is to be understood that the above-described arrangement is merely illustrative of the application of the principles of the invention, and that other arrangements may be devised by those skilled in the art without departing from the spirit and scope of the invention.

What is claimed is:

1. An apparatus for producing electrical signals representative of coefficients of an error location polynomial corresponding to a received signal vector from a three-error correcting BCH code comprising:

An input port for receiving and storing syndrome component signals;

a logic tree traversal circuit adapted to produce control bits that indicate a chosen path through a binary tree with levels, by combining syndrome component signals at each level to choose a path to a next level;

means for connecting the input port to the logic tree traversal circuit;

a polynomial generator circuit responsive to said control bits, coupled to the logic tree traversal circuit, adapted to produce signals corresponding to a third order error location polynomial representing the chosen path through the binary tree.

2. The apparatus of claim 1 wherein the input port is a binary latch.

* * * * *